(12) United States Patent
Booth et al.

(10) Patent No.: US 7,586,344 B1
(45) Date of Patent: Sep. 8, 2009

(54) DYNAMIC DELAY OR ADVANCE ADJUSTMENT OF OSCILLATING SIGNAL PHASE

(75) Inventors: Richard Booth, Hillsboro, OR (US); Phillip Johnson, Hillsboro, OR (US); Zheng Chen, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 80 days.

(21) Appl. No.: 11/872,950

(22) Filed: Oct. 16, 2007

(51) Int. Cl.
*H03B 19/00* (2006.01)
(52) U.S. Cl. ............ 327/117; 327/121; 377/48
(58) Field of Classification Search ............ None
See application file for complete search history.

(56) References Cited

U.S. PATENT DOCUMENTS

| | | | |
|---|---|---|---|
| 4,943,787 A * | 7/1990 | Swapp | 331/2 |
| 5,052,031 A * | 9/1991 | Molloy | 375/376 |
| 5,113,152 A * | 5/1992 | Norimatsu | 331/11 |
| 6,700,446 B2 * | 3/2004 | Ke | 331/1 A |
| 7,091,763 B1 | 8/2006 | Johnson et al. | |
| 7,253,674 B1 | 8/2007 | Johnson et al. | |
| 2007/0030936 A1 | 2/2007 | Johnson et al. | |

* cited by examiner

*Primary Examiner*—An T Luu
(74) *Attorney, Agent, or Firm*—Mendelsohn, Drucker, & Associates, P.C

(57) ABSTRACT

In one embodiment, the invention can be a clock-generating circuit having one or more clock-processing circuits, each outputting a clock signal having an adjustable phase. Each clock-processing circuit comprises a divider and a divisor control circuit. Each divider divides an input clock signal by a respective divisor value and outputs a corresponding output clock signal whose period is determined by the divisor value and the period of the input clock signal. Each divider receives the respective divisor value from the corresponding divisor control circuit, wherein the divisor value is selected in order to achieve a desired frequency and phase for the corresponding output clock signal. Temporarily changing a divisor value can advance or delay the phase of the corresponding output clock signal without having to reset the divider.

18 Claims, 2 Drawing Sheets

DYNAMIC DELAY OR ADVANCE ADJUSTMENT OF OSCILLATING SIGNAL PHASE

TECHNICAL FIELD

The current invention relates to electronic circuits, and more particularly, to clock-generating circuits.

BACKGROUND

Clock signals, which oscillate periodically, are used in many electronic circuits and for a multitude of reasons. An oscillator can provide a periodic clock signal. A clock signal of a lower frequency may also be generated by providing the oscillator output to a divider that outputs a clock signal whose frequency is a fraction of the oscillator frequency. Many electronic circuits use multiple clock signals having different frequencies. One way to generate such clock signals is to provide the oscillator output to a clock-processing circuit having one or more dividers, each divider receiving the oscillator output as an input, and one or more delay elements, where the oscillator output is used by the clock-processing circuit as a base signal of relatively-high frequency to generate clock signals of various frequencies and/or phases.

Some electronic circuits, such as certain RAM circuits, require that a first clock signal be a particular number of radians out-of-phase with a second clock signal. The requisite phase difference may be hardwired into the circuit. Alternatively, the requisite phase difference may be dynamically controlled and generated while the electronic circuit is operating. Some prior-art circuits can only delay and not advance the phase of the second clock signal relative to the first. Some prior-art circuits require resetting the dividers of the clock-processing circuits in order to achieve a desired relative phase delay.

SUMMARY

One embodiment of the invention can be a clock-generating circuit comprising one or more clock-processing circuits, wherein each clock-processing circuit comprises a divider and a divisor control circuit. The divider is adapted to (i) receive an input clock signal and a divisor value and (ii) provide an output clock signal whose frequency is substantially equal to the frequency of the input clock signal divided by the divisor value. The divisor control circuit is adapted to generate and adjust the divisor value to achieve a selected phase shift in the output clock signal without having to reset the divider.

Another embodiment of the invention can be a method for generating one or more output clock signals. The method comprises, for each output clock signal provided by a corresponding divider: (1) receiving an input clock signal and a divisor value, (2) providing the output clock signal whose frequency is substantially equal to the frequency of the input clock signal divided by the divisor value, and (3) generating and adjusting the divisor value to achieve a selected phase shift in the output clock signal without having to reset the corresponding divider.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
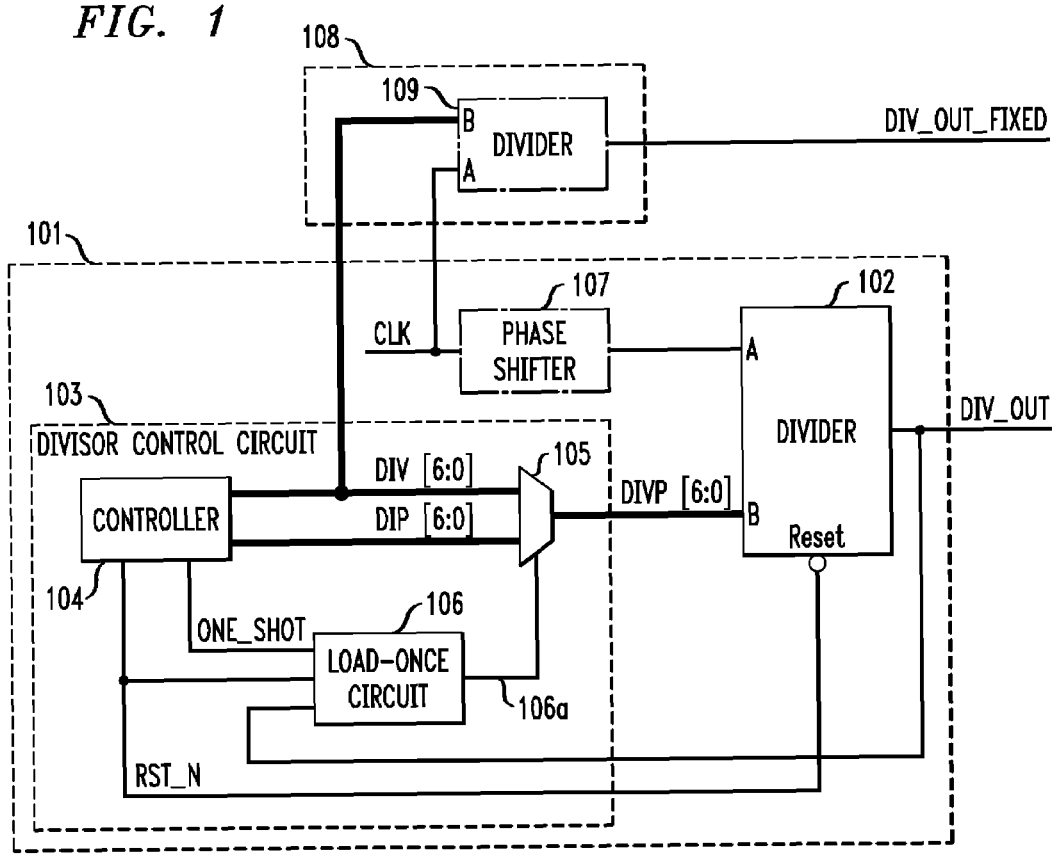
FIG. 1 shows a high-level block diagram of a clock-processing circuit in accordance with an embodiment of the present invention.

FIG. 1 shows a high-level block diagram of clock-processing circuit 101 in accordance with an embodiment of the present invention. Clock-processing circuit 101 is a digital circuit that comprises divider 102 and divisor control circuit 103. Clock-processing circuit 101 receives clock signal CLK as an input and provides clock signal DIV_OUT as an output. Clock-processing circuit 101 controls the frequency and phase of signal DIV_OUT, e.g., clock-processing circuit 101 can (i) increase or decrease the frequency of signal DIV_OUT, and (ii) advance or delay the phase of signal DIV_OUT. The frequency of signal DIV_OUT can be less than or equal to the frequency of CLK.

Divider 102 is a 7-bit down-count divider that divides the signal on input A based on the value on input B, and provides output signal DIV_OUT, i.e., the period of a cycle of DIV_OUT is determined by the period of the signal on input A and the value on input B. Divider 102 also has an inverting reset input that receives reset signal RST_N. Input A receives clock signal CLK, i.e., the dividend, while input B receives 7-bit signal DIVP, i.e., the divisor. The value provided by 7-bit signal DIVP can be any integer from 0 to 127. If the divisor is x, then divider 102 outputs a signal that cycles once for every x cycles of CLK, thereby substantially dividing CLK by DIVP. For example, if DIVP is 1100100 in binary, i.e., x is 100 in decimal, and CLK is a 250 MHz clock signal, then DIV_OUT would be a 2.5 MHz clock signal, i.e., DIV_OUT is substantially equal to CLK divided by 100.

Divisor control circuit 103 determines the value of the divisor provided to divider 102 via signal DIVP. FIG. 1 shows one implementation for divisor control circuit 103. Divisor control circuit 103 comprises controller 104, 2:1 mux 105, and load-once circuit 106. Controller 104 comprises operational logic for divisor control circuit 103. Controller 104 outputs (i) 7-bit signal DIV, which represents a baseline divisor, (ii) 7-bit signal DIP, which represents a temporary divisor, (iii) control signal ONE_SHOT, which is used to indicate that a phase shift is desired, and (iv) reset signal RST_N. Mux 105 has two 7-bit inputs. A first input receives DIV, while a second input receives DIP. Mux 105 has a selector input controlled by signal 106a from load-once circuit 106.

Determining a value to use for DIP, given a DIV value and a desired phase shift, can be accomplished, for example, using the formula below:

$$DIP = DIV + \frac{DIV \times \Delta\Phi}{360°} \qquad (1)$$

wherein $\Delta\Phi$ represents a supported desired phase shift in degrees. For example, given DIV=16 and $\Delta\Phi$=90°, we get DIP=16(1+¼)=20. Thus, for the above example, divider 102 would use a divisor of 20 for one cycle to shift the phase of output DIV_OUT by 90°. As another example, given DIV=16 and $\Delta\Phi$=−45°, we get DIP=16(1−⅛)=14. Thus, for the above example, divider 102 would use a divisor of 14 for one cycle to shift the phase of output DIV_OUT by −45°. The unique available phase shifts within one period are limited and dependent on the value of DIV.

Load-once circuit 106 receives as inputs (i) control signal ONE_SHOT, (ii) reset signal RST_N, and (iii) output signal DIV_OUT. Control signal ONE_SHOT is used to indicate to load-once circuit 106 when to have mux 105 select its second input, i.e., DIP, for output via signal DIVP. Output signal DIV_OUT is used to trigger functions in load-once circuit 106.

Load-once circuit 106 controls mux 105 via control signal 106a. Mux 105 provides to divider 102, via 7-bit signal DIVP, (i) the baseline divisor, from signal DIV, most of the time, and (ii) the temporary divisor, from signal DIP, if the phase of output signal DIV_OUT needs to be adjusted. Load-once circuit 106 controls mux 105 so as to provide the temporary divisor to divider 102 at a suitable time so that divider 102 uses the temporary divisor from signal DIP for one DIV_OUT cycle and adjusts the phase of output signal DIV_OUT appropriately. Then, load-once circuit 106 controls mux 105 so that mux 105 returns to providing the baseline divisor from signal DIV to divider 102, e.g., before the start of the next cycle.

Figure 2:
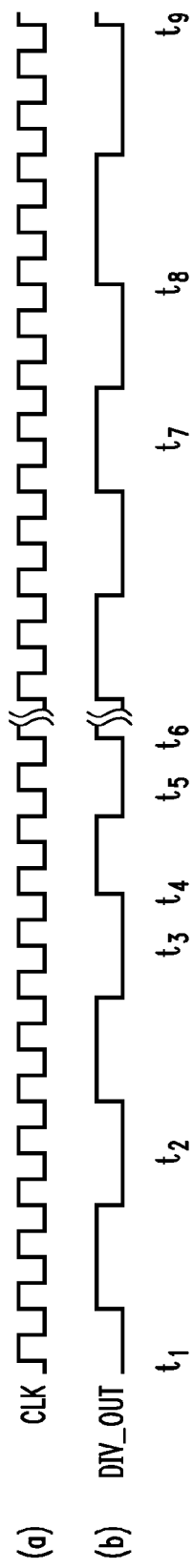
FIG. 2 shows a sample timing diagram for signals in FIG. 1.

FIG. 2 shows a sample timing diagram for clock signal CLK and output signal DIV_OUT of FIG. 1. FIG. 2 has a left-hand scenario showing a phase advance and a right-hand scenario showing a phase delay. Clock signal CLK has a constant, relatively-high frequency. Divider 102 loads the divisor value from signal DIVP for the next DIV_OUT cycle substantially at the time that divider 102 counts down to zero for the previous cycle, which is about one CLK clock cycle before the next DIV_OUT cycle. At time $t_1$, DIVP=4; thus, the frequency of the DIV_OUT cycle following $t_1$ is ¼ of the CLK clock frequency. If a phase shift of −90° is desired for output DIV_OUT, then using formula (1) yields a temporary divisor value of 3. At some time substantially between $t_2$ and $t_3$, the value of DIVP is changed to 3, so that at time $t_3$, DIVP=3. Thus, the next cycle of output DIV_OUT, which starts at time $t_4$, is at ⅓ of the CLK clock frequency. By time $t_5$, the value of DIVP is back to 4 so that, when the next DIV_OUT cycle starts at $t_6$, the frequency of output DIV_OUT is again ¼ of the CLK clock frequency, but has been phase-shifted by −90° relative to the previous version of DIV_OUT.

If a phase shift of +90° is desired next, then using formula (I) yields a temporary divisor value of 5. At some time substantially within two CLK clock cycles of $t_7$, the value of DIVP is changed to 5, so that, one CLK clock cycle prior to time $t_8$, DIVP=5. Thus, the next cycle of output DIV_OUT, which starts at time $t_8$, is at ⅕ of the CLK clock frequency. By time $t_9$, the value of DIVP is back to 4 so that, when the next DIV_OUT cycle starts, the frequency of output DIV_OUT is again ¼ of the CLK clock frequency, but has been phase-shifted by +90° relative to the previous version of DIV_OUT.

Figure 3:
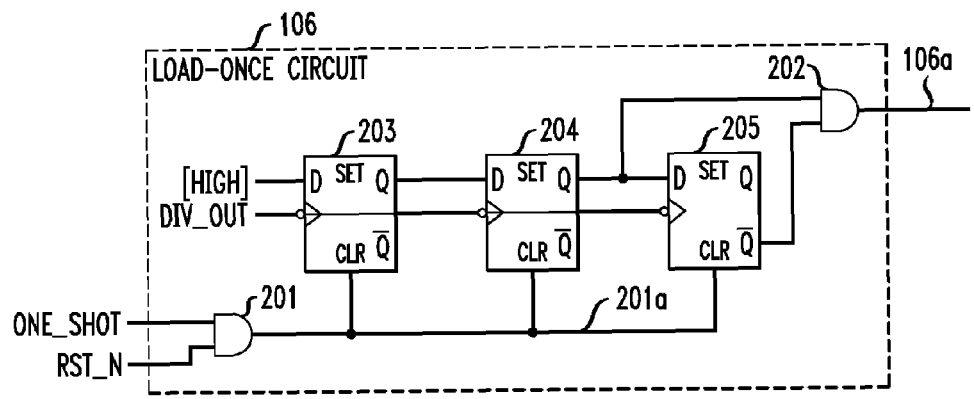
FIG. 3 shows a block diagram of one implementation of the load-once circuit of FIG. 1.

FIG. 3 shows a block diagram of an implementation of load-once circuit 106 of FIG. 1. Load-once circuit 106 comprises (i) AND gates 201 and 202 and (ii) D flip-flops 203, 204, and 205. Flip-flops 203, 204, and 205 are set up to be triggered on the falling edge (downtick) of output signal DIV_OUT. Flip-flops 203, 204, and 205 are connected so as to have signal 106a go high for about one cycle of DIV_OUT once in response to a triggering by control signal ONE_SHOT. The output of load-once circuit 106, signal 106a, is usually low because signal 106a is the output of AND gate 202 whose inputs are (i) the $\overline{Q}$ output of flip-flop 205 and (ii) the Q output of flip-flop 204, which feeds flip-flop 205. Most of the time, the Q output of flip-flop 205 is the same as the Q output of flip-flop 204. Therefore, the $\overline{Q}$ output of flip-flop 205 is typically the inverse of the Q output of flip-flop 204. However, as explained elsewhere herein, an appropriate triggering by control signal ONE_SHOT forces 106a high temporarily.

The inputs for AND gate 201 are reset signal RST_N and control signal ONE_SHOT. Reset signal RST_N goes high at reset and then stays high during normal operation of load-once circuit 106. Control signal ONE_SHOT is usually low, and pulses high when controller 104 determines that a phase shift in DIV_OUT is needed. Thus, in typical operation, the output of AND gate 201, signal 201a, follows control signal ONE_SHOT. Signal 201a triggers the reset inputs of flip-flops 203, 204, and 205, which are reset on a rising edge (uptick) at their respective reset inputs. Immediately following reset, the Q outputs of flip-flops 203, 204, and 205 are low and the $\overline{Q}$ output of flip-flops 203, 204, and 205 are high. After the first post-reset trigger, the Q output of flip-flop 203 goes high because the D input of flip-flop 203 is connected to always-high signal HIGH. After the second post-reset trigger, the Q output of flip-flop 204 goes high. Consequently, output signal 106a, based on AND gate 202, goes high. After the third post-reset trigger, the Q output of flip-flop 205 goes high; ergo, the Q/bar output of flip-flop 205 goes low. Consequently, output signal 106a returns to low, where it will remain until a couple of triggers after another pulse of control-signal ONE_SHOT.

Figure 4:
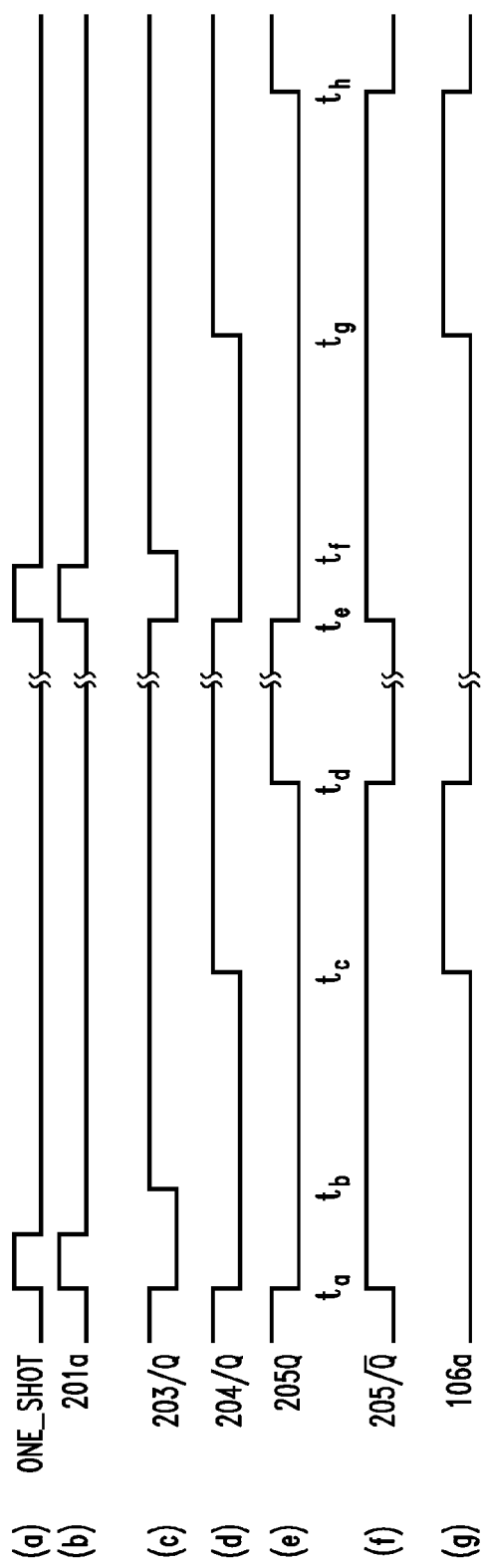
FIG. 4 shows a sample timing diagram for signals in FIG. 3.

FIG. 4 shows a sample timing diagram for signals in FIG. 3. FIG. 4 may be viewed in conjunction with the timing diagram of FIG. 2 for better understanding of this implementation of the present invention. The left-hand scenario of FIG. 4 corresponds to the left-hand scenario of FIG. 2 and the right-hand scenario of FIG. 4 corresponds to the right-hand scenario of FIG. 2. Prior to time $t_a$, control signal ONE_SHOT is low, the Q outputs of flip-flops 203, 204, and 205 are high, while their $\overline{Q}$ outputs are low; thus, 106a is low and mux 105 provides signal DIV to divider 102 via signal DIVP. At time $t_a$, control signal ONE_SHOT pulses high and, with reset signal RST_N high, output signal 201a follows. In response, the Q outputs of flips-flops 203, 204, and 205 (represented as 203/Q, 204/Q, and 205/Q, respectively) go low, while 205/$\overline{Q}$ goes high. Output signal 106a remains low. At time $t_b$, flip-flops 203, 204, and 205 are triggered by a downtick of output signal DIV_OUT, and 203/Q goes high, while 204/Q and 205/Q remain unchanged.

At time $t_c$, flip-flops 203, 204, and 205 are again triggered by the next downtick of output signal DIV_OUT and 204/Q goes high while 203/Q and 205/Q remain unchanged. Because 204/Q and 205/$\overline{Q}$ are both high now, output signal 106a goes high. Thus, at time $t_3$ in FIG. C, which is later than time $t_c$, divider 102 loads the temporary divisor value from its DIVP input. At time $t_d$, which is before time $t_5$, flip-flops 203, 204, and 205 are again triggered by the downtick of output signal DIV_OUT, 205/Q goes high, 205/$\overline{Q}$ goes low, while 203/Q and 204/Q remain high. Since, in this phase-advance scenario, DIP is less than DIV, the interval between $t_c$ and $t_d$ is shorter than the interval between $t_b$ and $t_c$. Because 204/Q and 205/$\overline{Q}$ are no longer the same, output 106a goes low. Thus, at time $t_5$ in FIG. 2, divider 102 loads the baseline divisor value from its DIVP input.

At time $t_e$, control signal ONE_SHOT is pulsed again, this time in order to delay, rather than advance, the phase of output DIV_OUT. The subsequent waveforms for 201a, 203/Q, 204/Q, 205/$\overline{Q}$, 205/$\overline{Q}$, and 106a are shown. These sections of the waveforms, i.e., for time $t_e$ and after, show substantially the same events as shown above, but occurring at different intervals because of the different temporary divisor value used. Since, in this phase-delay scenario, DIP is greater than DIV, the interval between $t_f$ (uptick of 203/Q) and $t_g$ (uptick of 204/Q) is longer than the interval between $t_g$ and $t_h$ (uptick of 205/Q).

It should be noted that FIGS. 2 and 4 are illustrative and assume ideal components. FIGS. 2 and 4 are not meant to represent actual timing diagrams of actual components, wherein component delays may be manifest.

In one embodiment, clock-processing circuit 101 forms part of a phase-locked loop (PLL) circuit. In one alternative embodiment, shown in FIG. 1, clock-processing circuit 101 further comprises optional phase shifter 107 adapted to shift the phase of clock signal CLK. Clock-processing circuit 101 is used for relatively coarse phase adjustment of output signal DIV_OUT, while phase-shifter 107 is used for relatively fine phase adjustment of output signal DIV_OUT. In one implementation of this embodiment, formula (1) is used to determine the value of DIP by rounding a resultant quotient up or down to a proximate integer, as appropriate for relatively coarse phase adjustment, and using the fractional part or remainder to determine a relatively fine phase adjustment of clock signal CLK.

In one embodiment, divider 102 of FIG. 1 is an N+1 divider wherein the divisor used by divider 102 is 1 plus the 7-bit value read from signal DIVP. This embodiment avoids the potential of attempting to divide by zero.

In one alternative embodiment, shown in FIG. 1, clock-processing circuit 101 is part of a clock-generating circuit comprising fixed-phase clock-processing circuit 108, which cannot dynamically adjust its phase. Clock-processing circuit 108 comprises divider 109, which receives clock signal CLK at its A input and divisor value DIV at its B input, and outputs DIV_OUT_FIXED. Working in conjunction, clock-processing circuit 101 and clock-processing circuit 108 can generate clock signals having a variable relative phase difference.

In one embodiment, a clock-generating circuit comprises two or more instances of clock-processing circuit 101. The frequency and phase of the output of each clock-processing circuit can be dynamically adjusted without resetting its divider. Working in conjunction, the clock-processing circuits can generate multiple clock signals with adjustable relative phase differences.

An embodiment has been described employing a particular implementation of a divisor control circuit. As would be appreciated by one of ordinary skill in the art, many other implementations of a divisor control circuit may be created that would function in substantially the same way as the divisor control circuit described herein and, thus, would not depart from the scope of the invention. In one alternative embodiment, controller 104 determines the appropriate divisor for each cycle of DIV_OUT and outputs a corresponding divisor value directly to divider 102 at an appropriate time without going through a mux.

An embodiment has been described employing a particular type of divider. As would be appreciated by one of ordinary skill in the art, other types of dividers may be used, e.g., (i) dividers having different divisor ranges or (ii) shift-register dividers, without departing from the scope of the invention.

An embodiment of a divisor control circuit has been described using a load-once circuit. In an alternative embodiment, the divisor control circuit provides a temporary divisor to a divider for more than one cycle of the divider output. For example, if it is desired to achieve relatively large phase shifts while minimally modifying the instant frequency of the divider output, then a phase shift may be performed with one or more smaller adjustments over several cycles of the divider output rather than with one large shift over one cycle of the divider output.

An embodiment has been described employing a particular implementation of a load-once circuit. As would be appreciated by one of ordinary skill in the art, many other implementations of a load-once circuit may be created that would function in substantially the same way as the load-once circuit described herein and, thus, would not depart from the scope of the invention. For example, in an alternative embodiment, a load-once circuit does not receive a feedback signal from the divider. In one alternative embodiment of load-once circuit 106, flip-flop 204 is eliminated and the D input of flip-flop 205 is connected to the Q output of flip-flop 203.

In an alternative embodiment, one or more signals are inverted with corresponding modifications of components and/or other signals, as necessary and as would be appreciated by one of ordinary skill in the art. In an alternative embodiment, one or more components are triggered by a different edge of a signal with corresponding modifications of signals and/or other components, as necessary and as would be appreciated by one of ordinary skill in the art.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

Signals and corresponding nodes or ports may be referred to by the same name and are interchangeable for purposes here.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures. Furthermore, the use of particular terms and phrases herein is for the purpose of facilitating the description of the embodiments presented and should not be regarded as limiting.

References in descriptions of alternative embodiments to particular figures or previously described embodiments do not limit the alternatives to those particular shown or previously-described embodiments. Alternative embodiments described can generally be combined with any one or more of the other alternative embodiments shown or described.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

We claim:

1. A clock-generating circuit comprising one or more clock-processing circuits, wherein each clock-processing circuit comprises:
   a divider adapted to:
      receive an input clock signal and a divisor value; and
      provide an output clock signal whose frequency is substantially equal to the frequency of the input clock signal divided by the divisor value; and
   a divisor control circuit adapted to generate and adjust the divisor value to achieve a selected phase shift in the output clock signal, wherein the divisor control circuit is further adapted to change the divisor value from a baseline divisor value to a temporary divisor value for a specified number of cycles of the output clock signal and then change the divisor value back to the baseline value to achieve the selected phase shift.

2. The circuit of claim 1, wherein the clock-generating circuit comprises two or more clock-processing circuits, each of which has an independent divisor value used to generate its corresponding output clock signal.

3. The circuit of claim 2, wherein the input clock signals of the two or more clock-processing circuits are substantially identical.

4. The circuit of claim 1, wherein the specified number of cycles of the output clock signal is one.

5. The circuit of claim 1, wherein the divisor control circuit comprises:
   a controller adapted to output the baseline divisor value, the temporary divisor value, and a one-shot control signal;
   a load-once circuit adapted to output a mux control signal based on (i) the one-shot control signal and (ii) the output clock signal; and
   a mux having the baseline divisor value and the temporary divisor value as inputs, the mux controlled by the mux control signal so as to:
      output the baseline divisor value for one or more cycles of the output clock signal;
      then output the temporary divisor value for one cycle of the output clock signal in response to an appropriate value of the one-shot control signal; and
      then output the baseline divisor value for one or more cycles of the output clock signal.

6. The circuit of claim 5, wherein the load-once circuit comprises:
   a first flip-flop having:
      a data input connected to a fixed signal;
      a trigger input connected to the output clock signal;
      a data output; and
      a reset input adapted to be triggered based on the one-shot control signal;
   a second data flip-flop having:
      a data input connected to the data output of the first flip-flop;
      a trigger input connected to the output clock signal;
      a data output; and
      a reset input adapted to be triggered based on the one-shot control signal;
   a third flip-flop having:
      a data input connected to the data output of the second flip-flop;
      a trigger input connected to the output clock signal;
      a data output; and
      a reset input adapted to be triggered based on the one-shot control signal; and
   a first logic gate adapted to output the mux control signal and having:
      a first input connected to the data output of the second flip-flop; and
      a second input connected to the data output of the third flip-flop.

7. The circuit of claim 6 further comprising a second logic gate having:
   a first input connected to the one-shot control signal;
   a second input connected to a reset signal; and
   an output connected to the reset inputs of the first, second, and third flip-flops.

8. The circuit of claim 1, wherein, in order to substantially achieve the selected phase shift, the temporary divisor value is substantially determined by using the formula $$DIP = DIV + \frac{DIV \times \Delta\Phi}{360°},$$

wherein DIP is the temporary divisor value, DIV is the baseline divisor value, and $\Delta\Phi$ is the selected phase shift in degrees.

9. The circuit of claim 1, wherein the clock-generating circuit further comprises circuitry adapted to shift the phase of the input clock signal prior to application to the divider.

10. The circuit of claim 1, wherein the divider is an N+1 divider.

11. The circuit of claim 1, wherein the clock-generating circuit further comprises a fixed-phase clock-processing circuit.

12. A method for generating one or more output clock signals, the method comprising, for each output clock signal provided by a corresponding divider:
   receiving an input clock signal and a divisor value;
   providing the output clock signal whose frequency is substantially equal to the frequency of the input clock signal divided by the divisor value; and
   generating and adjusting the divisor value to achieve a selected phase shift in the output clock signal by temporarily changing the divisor value from a baseline value to a temporary value for a specified number of cycles of the output clock signal and then changing the divisor value back to the baseline value.

13. The method of claim 12, wherein the specified number of cycles of the output clock signal is one.

14. The method of claim 12, wherein, in order to substantially achieve the selected phase shift, the temporary divisor value is substantially determined by using the formula $$DIP = DIV + \frac{DIV \times \Delta\Phi}{360°},$$

wherein DIP is the temporary divisor value, DIV is the baseline divisor value, and $\Delta\Phi$ is the selected phase shift in degrees.

15. The method of claim 12, wherein two or more clock signals are generated using independent corresponding divisor values.

16. A clock-processing circuit comprising:
   a divider adapted to:
      receive an input clock signal and a divisor value; and
      divide the input clock signal by the divisor value to produce an output clock signal with a first frequency; and
   a divisor control circuit adapted to adjust the divisor value to achieve a selected phase shift in the output clock signal by temporarily changing the divisor value from a baseline value to a temporary value to produce the output clock signal with a second frequency, and then changing the divisor value back to the baseline value to again produce the output clock signal with the first frequency.

17. The clock-processing circuit of claim 16, wherein the divisor control circuit is further adapted to:
   produce a baseline divisor signal and a temporary divisor signal; and
   switch from the baseline divisor signal to the temporary divisor signal to achieve the selected phase shift and then switch back to the baseline divisor signal.

18. The clock-processing circuit of claim 16, wherein the divisor control circuit is further adapted to change the divisor value from the baseline divisor value to the temporary divisor value for a specified number of cycles of the output clock signal.

* * * * *